United States Patent
Mattisson (10) Patent No.: US 7,362,193 B2
(45) Date of Patent: Apr. 22, 2008

(54) OSCILLATOR AND AN INTEGRATED CIRCUIT

(75) Inventor: Sven Mattisson, Bjarred (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 49 days.

(21) Appl. No.: 10/526,244

(22) PCT Filed: Aug. 14, 2003

(86) PCT No.: PCT/EP03/09034

§ 371 (c)(1),
(2), (4) Date: Sep. 19, 2005

(87) PCT Pub. No.: WO2004/023641

PCT Pub. Date: Mar. 18, 2004

(65) Prior Publication Data

US 2006/0049883 A1 Mar. 9, 2006

Related U.S. Application Data

(60) Provisional application No. 60/411,184, filed on Sep. 16, 2002.

(30) Foreign Application Priority Data

Sep. 6, 2002 (EP) .............................. 02388057.8

(51) Int. Cl.
*H03B 5/36* (2006.01)
(52) U.S. Cl. ...................................... 331/158; 331/163
(58) Field of Classification Search ................ 331/158, 331/163
See application file for complete search history.

(56) References Cited

U.S. PATENT DOCUMENTS

2002/0093389 A1* 7/2002 Midtgaard ................. 331/158

2004/0090280 A1* 5/2004 Gomez ..................... 331/158

FOREIGN PATENT DOCUMENTS

| EP | 0335493 | 10/1989 |
|----|---------|---------|
| EP | 0767532 | 4/1997 |
| EP | 1215812 | 6/2002 |
| SU | 1771058 | 10/1992 |

OTHER PUBLICATIONS

Eric A. Vittoz, et al.; "High-performance Crystal Oscillator Circuits: Theory and Application"; IEEE Journal of Solid-State Circuits, vol. 23, No. 3. Jun. 1988.

* cited by examiner

*Primary Examiner*—Joseph Chang
(74) *Attorney, Agent, or Firm*—Michael Cameron (57) ABSTRACT

A balanced crystal oscillator circuit comprising: a piezoelectric element Xtal (207; 215; 222,221; 313); a first oscillator subcircuit (202; 210; 218; 302) incorporating a transistor (204;212;220;304); and a second oscillator subcircuit (201;209;217; 301) incorporating a transistor (203; 211; 219; 303); wherein the transistors each have different types of transistor terminals (C,B,E; D;G;S), and wherein the oscillator subcircuits are configured with at least three interconnections. Each interconnection comprise a pair of like type of transistor terminals; wherein a first of said interconnections constitutes a connection to a ground reference (gnd); a second of said interconnections is via a first resonator element (207;215;223;313); and a third of said interconnections is via a second resonator element (208;216; 224;314); said first and second circuits are arranged to interact by means of said first and second resonator elements to form a balanced oscillator signal. A dual common base or a dual common collector configuration is preferred.

17 Claims, 4 Drawing Sheets

OSCILLATOR AND AN INTEGRATED CIRCUIT

This patent application claims the benefit of priority from U.S. Provisional Patent Application Ser. No. 60/411,184 filed on Sep. 16, 2002. This application incorporates by reference the entire disclosure of U.S. Provisional Patent Application Ser. No. 60/411,184.

TECHNICAL FIELD

This invention relates to a balanced crystal oscillator circuit comprising: a piezoelectric element; a first oscillator subcircuit incorporating a transistor; and a second oscillator subcircuit incorporating a transistor; wherein the transistors each have different types of transistor terminals, and wherein the oscillator subcircuits are configured with at least three interconnections.

BACKGROUND OF THE INVENTION

A balanced crystal oscillator circuit can be employed in various electronic circuits. However, a special field of application is within communications equipment—especially telecommunications equipment—wherein frequency references are generated or synthesized as periodic signals for modulators, demodulators, up- and down frequency converters, for timing circuits etc. Typically, the periodic signals are square-wave signals.

The periodic signals have a fundamental frequency and are generated by a so-called frequency synthesizer, which provides the fundamental frequency of the periodic signals as a multiplicity of the fundamental frequency for a reference signal. In order to meet requirements, related to frequency stability or timing precision, set forth in a standard, which the equipment is intended to comply with, a crystal oscillator is typically required for providing a sufficiently stable or precise reference signal.

Communications equipment involves signal processing within different frequency ranges; the circuits arranged to process signals related to modulation of an RF carrier signal operate within the highest frequency ranges and are typically denoted RF stages. Circuits arranged to process signals related to the signal to be communicated on the carrier signal operate within the lower frequency ranges and are denoted base band stages or base band circuitry.

The RF stages are primarily involved with processing signals at relatively high power and at relatively high frequencies; hence heavy noise sources exist as an unavoidable inheritance from the RF stages. The base band circuitry typically involves lower frequency signals at lower power levels, however the signal processing in this circuitry is typically carried out as digital signal processing and hence involves heavy digital switching. The base band circuitry is thus also a vigorous noise source.

For communications equipment providing e.g. wireless communication at Radio Frequencies (RF) a so-called RF frequency synthesizer is provided with the reference signal from a crystal oscillator running typically at 10-40 MHz.

For relatively complex and compact communications equipment such as cellular telephones, Bluetooth™ communication devices etc., ever tighter integration levels makes it desirable to integrate the various circuits of a communications device on a single integrated circuit. Such an integrated circuit is typically of the semiconductor type, where a semiconductor chip (a silicon substrate) is accommodated on a ceramic substrate (or a so-called metal header) in a package with terminals for obtaining electrical contact with a Printed Circuit Board (PCB). Electrical contact between the silicon substrate and the ceramic substrate is accomplished by means of bonding wires. Similarly, electrical contact between the ceramic substrate and the terminals of the package is also accomplished by bonding.

As a consequence of the above desired integration of the circuits and the individual properties of the circuits with respect to generation and emission of noise, the oscillator circuit is situated in a very noisy environment. Hence, the oscillator is prone to pick up interference from the silicon substrate of the integrated circuit. Additionally, since resonator components of the oscillator circuit often are placed outside the integrated circuit (i.e. outside the integrated circuit package), the oscillator is also prone to pick up interference by means of the bonding wires and the terminals. Indeed the crystal is very stable and is to some extent able to suppress the interference, but since requirements are very tight, reduction of interference sensitivity is an ongoing challenge for circuit designers. For a GSM/GPRS cellular terminal, as little as 0.1 ppm frequency shift as a maximum is acceptable, for example in a situation where a typical component such as a Voltage Controlled Oscillator VCO switches on and off or changes frequency.

However, the major cause of undesired frequency shifts or frequency error is due to a shift in the operating point (because of interference-induced DC-voltage drops in common supply wires or due to rectification of interference signals causing local DC shifts in current or voltage and/or due to interference signals entering the crystal oscillator circuit) where non-linear components are modulated (related to changes in the device $g_m$ or input capacities). To some extent, on-chip shielding may be used, but the bonding wires and metal tracks are exposed to magnetic fields. A balanced structure as opposed to a single-ended structure helps, but even common-mode (i.e. exposures affecting both of a pair of balanced signals) interference components are also harmful.

Generally, it should be noted that a crystal oscillator provides a very stable oscillator frequency despite variations in supply voltage level and in load characteristics and is thus a very robust oscillator type.

PRIOR ART

Figure 1:
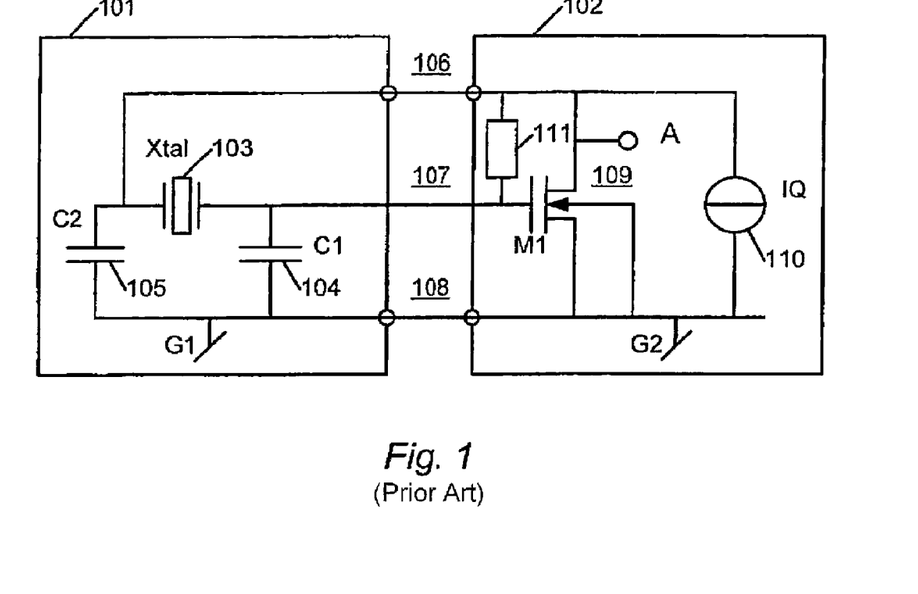
FIG. 1 shows a single-ended crystal oscillator.

A well-known oscillator is the so-called Pierce oscillator with a single CMOS gain cell as proposed by Eric Vittoz ("High-Performance Crystal Oscillator Circuits: Theory and Application"; IEEE Journal of Solid State Circuits, pages 774-783, June 1988). Due to current consumption considerations many low-frequency crystal oscillators typically use a single CMOS gain cell as proposed by Vittoz. Such an oscillator is shown in FIG. 1. This gain cell uses single-ended signals, and as a consequence, grounding of the oscillator is a severe problem for large digital chips. This lack of sufficient grounding may result in noise and interference injection into the core of the oscillator. Similarly, the integrated circuit substrate will not be connected directly to the resonator ground, thereby also providing an interference path into the circuit. However, the despite the apparent drawbacks, it is a popular oscillator since it can be implemented with a single CMOS inverter.

Alternatives to the above CMOS-inverted based oscillator exist. The Pierce oscillator can also be based on a Bipolar Junction Transistor (BJT) coupled in a common-collector coupling. Less favoured single-ended crystal oscillators with Bipolar Junction Transistors are based on common-emitter or common-base couplings.

The above single-ended oscillators all suffer from not being sufficiently robust to substrate interference.

SU 1 771 058 discloses a differential oscillator with a negative-impedance converter (NIC) formed by two transistors and two resistors coupled between supply voltage and the collector terminal of the two transistors, respectively. The base terminal of one of the transistors is connected to the collector terminal of the other transistor, and vice versa. A crystal is coupled between the emitter terminals of the two transistors. The NIC presents a negative resistance across the crystal, which undamps the circuit when properly dimensioned, such that it will oscillate close to the resonance frequency of the crystal.

Due to the differential operation, it is possible to suppress some of the interference induced on the bonding-wire; e.g. interference in the form of RF-induced spurious frequencies. However, a drawback of this and other oscillators is a lack of robustness to the so-called substrate interference, which may originate in e.g. circuits on the same substrate involving intense digital switching, or other strong interference induced at the oscillator nodes, e.g. from another on-chip RF oscillator. This imperfect performance results in small variations in the oscillation frequency, so called frequency shifts. Frequency shifts may, for example, occur when digital switching activities start or stop depending on circuit activity, or when nearby RF oscillators are turned on or off between so called idle, transmit (TX), or receive (RX) modes, or when an RF oscillator is tuned to another frequency. A typical frequency shift when an RX or TX RF oscillator switches on or off may be up to one part per million (ppm). The GSM/GPRS requirements are more stringent than 1 ppm and, generally, this oscillator does not perform well enough with respect to the GSM/GPRS requirements.

As stated above, an integrated oscillator is prone to pick up substrate interference. The Pierce oscillator (FIG. 1) will be sensitive to substrate interference via the so-called back-gate effect (i.e. a signal between its substrate and source terminal will be amplified with a gain of approximately 30% of its forward transconductance). Furthermore, the drain has a parallel-plate capacitance to the substrate and this path may also cause noise injection. Replacing the MOS device with a bipolar transistor does remove the back-gate effect but not the parallel-plate substrate capacitance.

To summarize, neither the Pierce oscillator nor the NIC-based oscillator circuits are robust to substrate interference although some common-mode noise reduction exists in the NIC-based oscillator.

SUMMARY OF THE INVENTION

The above problems are solved when the oscillator mentioned in the opening paragraph is characterized in that each interconnection, between the first and second oscillator subcircuit, comprises a pair of like types of transistor terminals; wherein a first of said interconnections constitutes a connection to a ground reference, or signal ground reference like a supply rail; a second of said interconnections is via a first resonator element; and a third of said interconnections is via a second resonator element; said first and second circuits are arranged to interact by means of said first and second resonator elements to form a balanced oscillator signal.

The first and second oscillator subcircuit can be comprised of a transistor, either a Bipolar Junction Transistor or a Metal Oxide Semiconductor; and circuitry for biasing the transistor and filtering out undesired frequency components. A filter can be in the form of e.g. a simple RC filter. The like pair of transistor terminals can be a pair of collector terminals, formed by a collector terminal from each of the transistors or a pair of drain terminals for BJT or MOS transistors, respectively. Typically, the first and second resonator elements are a capacitor and a piezoelectric crystal, respectively. The two oscillator subcircuits interact by lapping energy back and forth between the first and second oscillator circuits at the resonator (oscillator) frequency. The balanced output signal is preferably provided across the first or second resonator element.

Consequently, a very precise oscillator, which is robust to interference, is provided. The oscillator is five to ten times less sensitive to interference than the above-mentioned prior art oscillators.

Additionally, the oscillator possesses excellent frequency shift performance, which allows the oscillator to be used in combination with other on-chip oscillators, e.g. RF oscillators, thus providing a stable reference frequency under all operational modes. The frequency shift performance can be measured as the change in frequency of the oscillator according to the present invention when interferers, like digital switching circuits or other oscillators, are switched on or off or when their operating conditions are otherwise changed. For the oscillator according to the present invention, the oscillation frequency is only affected by the interference to a very limited extent. This in turn makes it possible to comply with requirements concerning the variation of its output frequency without additional circuitry for reducing this variation. Test have shown that the present oscillator is able to fulfil the requirements set by the GSM/GPRS standards.

Preferably, the balanced output signal is provided at a first circuit junction (T1a; T2a; T3a) and at a second circuit junction (T1b; T2b; T3b) connected to a first and second terminal, respectively, from one of the pairs of like type of transistor terminals; which are interconnected by a resonator element.

In expedient embodiments the transistors are of the Bipolar Junction Transistor (BJT) type. Since BJT transistors do not have the so-called back-gate effect that MOS transistors have, this source to substrate interference path is avoided.

In a preferred embodiment, the first, second, and third of said interconnections consist of a pair of collector-type terminals, base-type terminals, and emitter-type terminals, respectively; thereby configuring the balanced oscillator circuit with a dual common-collector transistor coupling. This preferred embodiment is advantageous in that it is relatively easy to bias e.g. by a simple resistor subcircuit. Additionally, since the collector is connected to the ground reference, the substrate portion that constitutes the collector of the transistors can provide shielding of the base and emitter of the transistors, thus further protecting the oscillator from noise signals.

In an alternative type of embodiment, the first, second, and third of said interconnections consist of a pair of base-type terminals, collector-type terminals, and emitter-type terminals, respectively, thereby configuring the balanced oscillator circuit with a dual common-base transistor coupling.

When the first resonator element is constituted by a piezoelectric element and the second resonator is constituted by a capacitor, an advantageous configuration of the oscillator is achieved. Despite the balanced operation of the oscillator only a single crystal need be used, thereby providing a cost effective balanced oscillator.

In an alternative type of embodiment the first, second, and third of said interconnections consist of a pair of emitter-type terminals, collector-type terminals, and base-type terminals, respectively, thereby configuring the balanced oscillator circuit with a dual common-emitter transistor coupling.

Expediently, at least one of the transistors is provided with bias current by means of a resistor connected between the emitter of a transistor and a supply voltage. The resistor bias circuit offers an advantage, over active current sources in that the resistor subcircuit offers an advantage with respect to substrate isolation. Thus, by means of the resistor subcircuit, biasing of the transistors is provided without introducing an interference path to the transistor from other portions of the substrate.

When a more stable operating point of the transistors than provided with the resistor based bias subcircuit, is required, at least one of the transistors is/are provided with bias current by means of an active current source. This, more stable operating point, may be required when conditions internal or external to the integrated circuit influence considerably and act otherwise uncontrollably on the operating point.

Preferably, the transistors are operated in class C. Thereby, the loading of the resonator circuit is lower resulting in lower frequency shift due to RF interference. Additionally, since output current only flows in a time-interval less than one half-cycle of a whole oscillator cycle, current consumption is very low. The time interval is also denoted the conduction angle.

Preferably, the transistors are of the Metal Oxide Semiconductor (MOS) type.

It is stated above that BJT devices in a common-collector coupling provide a shielding of the base and emitter; but unfortunately, MOS devices do not provide a similar shielding in the corresponding common-drain coupling, unless a cost expensive triple-well technology is applied. However, when the oscillator is characterized in that the first, second, and third of said interconnections consist of a pair of drain-type terminals, gate-type terminals, and source-type terminals, respectively; to thereby form a dual common-drain transistor coupling, the relatively large signal swing between the gate and the substrate, as well as source and substrate, will make the substrate interference relatively small.

Preferably, the first, second, and third of said interconnections consist of a pair of gate-type terminals, drain-type terminals, and source-type terminals, respectively, thereby configuring the balanced oscillator circuit with a dual common-gate transistor coupling.

Preferably, the first resonator element is constituted by a piezoelectric element and the second resonator is constituted by a capacitor.

A general problem with crystal oscillators is the fact that they may start in an unwanted mode. In principle, an oscillator may oscillate at any frequency where the loop-gain is sufficiently high (i.e. greater than one) while the phase shift equals 180 degrees. Such resonance frequencies often occur at crystal overtones or where parasitic resonances can be found (typically at higher frequencies). This problem is solved when the oscillator circuit is configured with an RC-circuit forming a loop-gain pole in the frequency range above a primary oscillating frequency of the oscillating output signal. Preferably, such generally unwanted resonance is suppressed by inserting a LC filter in series with the crystal.

The invention also relates to an integrated circuit comprising a circuit which in combination with the resonator elements constitutes the oscillator as set forth above; said integrated circuit comprising terminals for electric interconnection with the resonator elements. Thereby, the components that take up a large area on the integrated circuit chip are arranged outside the integrated circuit chip. This is a more space- and cost-effective solution.

Additionally, the invention relates to an integrated circuit comprising a circuit, which in combination with a piezoelectric element constitutes the oscillator as set forth above; said integrated circuit comprising terminals for electric interconnection with the piezoelectric element. Thus, if sufficient space on the integrated circuit chip is available, the capacitive components can be accommodated on the integrated circuit chip, consequently arranging the piezoelectric element only outside the chip.

Moreover, the invention relates to a mobile telephone comprising the oscillator as set forth above.

The invention will be explained more fully below in connection with a preferred embodiment and with reference to the drawings, in which:

DESCRIPTION OF A PREFERRED EMBODIMENT

FIG. 1 shows a single-ended crystal oscillator. The oscillator circuit is illustrated to comprise a first and a second subcircuit. The first subcircuit 101 is typically implemented by means of passive components mounted on a printed circuit board (PCB), whereas the second subcircuit 102 is implemented on a substrate in an integrated circuit (IC) component that is mounted on the PCB.

The first subcircuit 101 comprises an oscillating device in the form of a crystal (Xtal) 103 for instance with a nominal oscillating frequency in the range of 10-40 MHz. The crystal is electrically connected to the second subcircuit 102 by means of two connectors 106 and 107.

At frequencies about the nominal series resonance frequency the crystal has relatively low impedance. However, at frequencies below and above the series resonance frequency the crystal has relatively high impedance. Thus, below and especially above the nominal frequency an oscillating signal across the crystal will be sensitive to electromagnetic interference, that is noise, induced on the connectors 106 and 107. Capacitors 104 and 105 are connected to the crystal to provide a defined load and resonance frequency—and to couple high frequency signal components to a ground reference G1. The second subcircuit 102 comprises an active device 109 in the form of an MOS transistor biased by a current source (IQ) 110. The MOS transistor and the current source are connected to a ground reference G2. The ground reference G2 is electrically connected to the ground reference G1 by means of a conductor 108.

Thus it is possible to detect an oscillating signal with reference to the ground reference G2 at the circuit junction indicated with a capital 'A' in the second subcircuit. A bias resistor 111 is applied between the drain and gate terminal of transistor 109 to provide proper working conditions for the transistor.

An oscillator of the above-described type typically provides timing signals, extracted from the oscillator signal by means of e.g. a two-transistor CMOS inverter, to be provided to other subcircuits on the substrate in the above-mentioned integrated circuit.

Figure 2A:
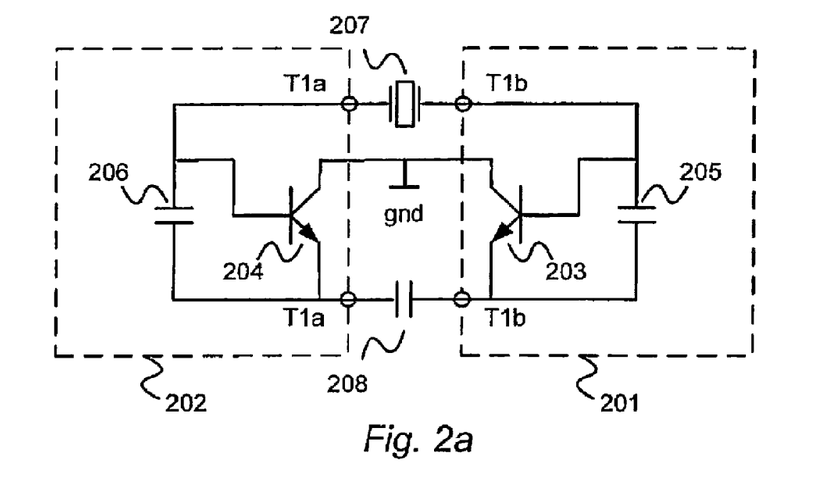
FIG. 2a shows a balanced crystal oscillator based on a dual common-collector transistor coupling.

FIG. 2a shows a balanced crystal oscillator based on a dual common-collector transistor coupling. The balanced crystal oscillator comprises two like oscillator subcircuits or subcircuits 201 and 202. The subcircuits are functionally like subcircuits that do not describe the physical implementation of the oscillator. As regards the physical implementation, a piezoelectric crystal 207 and optionally capacitors 208, 206, and 205 are placed outside an integrated circuit since they occupy too much space on the integrated circuit. Other components of the oscillator such as e.g. transistors 203 and 204 are placed on the integrated circuit.

The transistors have three different transistor terminals, i.e. collector, base, and emitter in case the transistors are of the bipolar (BJT) type, and source, gate, and drain in case the transistors are of the Metal Oxide Semiconductor (MOS) type.

The subcircuits are coupled together by means of three interconnections, where each interconnection comprises a pair of like type of transistor terminals. Hence, an interconnection includes the circuit path from a transistor terminal (collector, base, emitter; or drain, gate, source) in the first subcircuit to a like transistor terminal in the second subcircuit—the two transistor terminals forming a pair of terminals. A first of the three interconnections comprises a piezoelectric crystal (Xtal) 207, which couples the base terminal of transistor 204 to the base terminal of transistor 203. A second of the three interconnections comprises a resonator element in the form of a capacitor 208, which couples the emitter terminal of transistor 204 to the emitter terminal of transistor 203. A third of the three interconnections connects the collector terminal of transistor 204 and the collector terminal of transistor 203 to a ground (gnd), or a signal ground (e.g. Vcc), reference. Preferably, this ground reference is a ground reference in an integrated circuit.

A balanced (i.e. two-wire) output oscillator signal is provided either across the piezoelectric crystal 207 at circuit junctions or terminals T1a and T1b or across the capacitor 208 at circuit junctions or terminals T2a and T2b. Hence, the balanced output signal is provided at one of the pairs of like type of transistor terminals i.e. at the pair of base terminals or at the pair of emitter terminals.

Figure 2B:
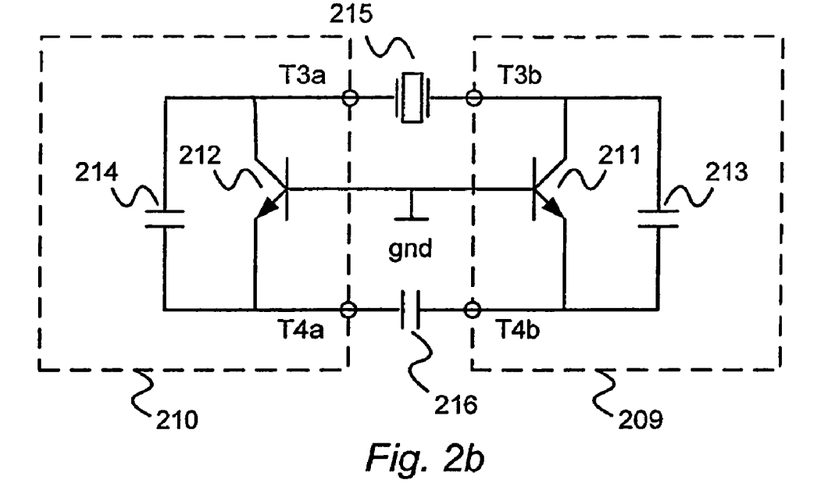
FIG. 2b shows a balanced crystal oscillator based on a dual common-base transistor coupling.

FIG. 2b shows a balanced crystal oscillator based on a dual common-base transistor coupling. The balanced crystal oscillator comprises two like oscillator subcircuits or subcircuits 210 and 209. Each subcircuit comprises a capacitor 214, 213 and an active device in the form of a transistor 212, 211. The transistors have three different transistor terminals, i.e. collector, base, and emitter in case the transistors are of the bipolar (BJT) type, and source, gate, and drain in case the transistors are of the Metal Oxide Semiconductor (MOS) type.

The subcircuits are coupled together by means of three interconnections, where each interconnection consists of a pair of like type of transistor terminals. A first of the three interconnections comprise a piezoelectric crystal (Xtal) 215, which couples the collector terminal of transistor 212 to the collector terminal of transistor 211. A second of the three interconnections comprise a resonator element in the form of a capacitor 216, which couples the emitter terminal of transistor 212 to the emitter terminal of transistor 213. A third of the three interconnections connects the base terminal of transistor 212 and the base terminal of transistor 213 to a ground reference, gnd. Again, it should be noted that an interconnection includes the circuit path from a transistor terminal (collector, base, emitter; or drain, gate, source) in the first subcircuit to a like transistor terminal in the second subcircuit—the two transistor terminals forming a pair of terminals.

A balanced output oscillator signal is provided either across the piezoelectric crystal 215 at terminals T3a and T3b or across the capacitor 216 at terminals T4a and T4b. Hence, the balanced output signal is provided at one of the of the pairs of like type of transistor terminals i.e. at the pair of collector terminals or at the pair of emitter terminals.

It should be noted that the subcircuits 210 and 209 are functionally like subcircuits that do not describe the physical implementation of the oscillator. As regards the physical implementation, the resonator element(s) 215 and optionally 214, 213, and 216 are placed outside an integrated circuit, whereas the other components typically are placed on the integrated circuit.

Figure 2C:
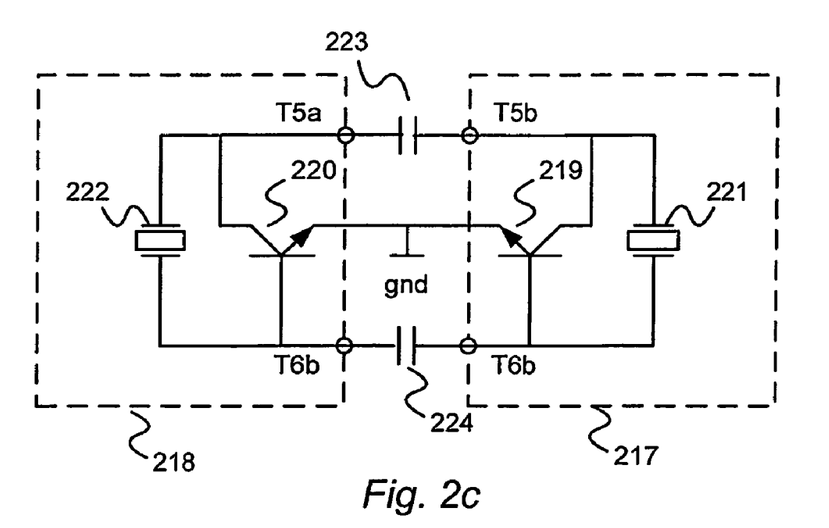
FIG. 2c shows a balanced crystal oscillator based on a dual common-emitter transistor coupling.

FIG. 2c shows a balanced crystal oscillator based on a dual common-emitter transistor coupling. The balanced crystal oscillator comprises two like oscillator subcircuits or subcircuits 218 and 217. Each subcircuit comprises a piezoelectric crystal 222, 221 and an active device in the form of a transistor 220, 219. The transistors have three different transistor terminals, i.e. collector, base, and emitter in case the transistors are of the bipolar (BJT) type, and source, gate, and drain in case the transistors are of the Metal Oxide Semiconductor (MOS) type.

The subcircuits are coupled together by means of three interconnections, where each interconnection consists of a pair of like type of transistor terminals. A first and a second of the three interconnections comprise resonator elements in the form of a capacitor 223 and 224, respectively, which couple the collector terminal of transistor 220 to the collector terminal of transistor 219 and the base terminal of transistor 220 to the base terminal of transistor 219, respectively. A third of the three interconnections connects the emitter terminal of transistor 220 and the emitter terminal of transistor 219 to a ground reference, gnd. Hence, the piezoelectric elements 221 and 222 of subcircuit 217 and 218, respectively, with a like nominal oscillating frequency, interact to provide a balanced output oscillator signal with a frequency at or near to the nominal oscillating frequency.

The balanced output oscillator signal is provided either across the capacitor 223 at terminals T5a and T5b or across the capacitor 224 at terminals T6a and T6b. Hence, the balanced output signal is provided at one of the of the pairs of like type of transistor terminals i.e. at the pair of collector terminals or at the pair of emitter terminals. It should be noted that the subcircuits 218 and 217 are functionally like subcircuits that do not describe the physical implementation of the oscillator.

Figure 3:
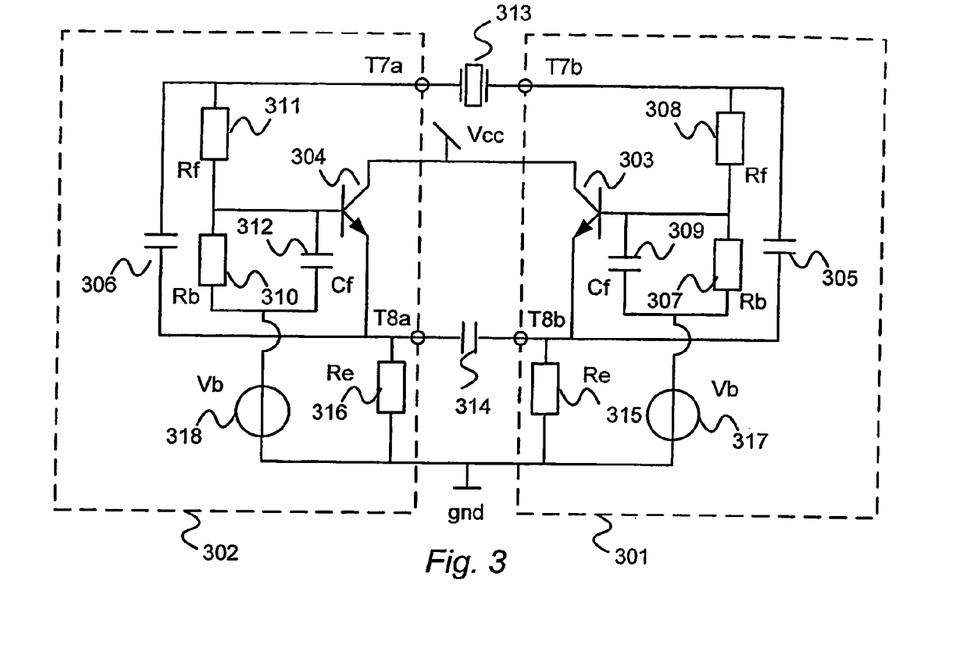
FIG. 3 shows a balanced crystal oscillator based on a dual common-collector transistor coupling with a bias circuit.

FIG. 3 shows a balanced crystal oscillator based on a dual common-collector transistor coupling with a bias circuit. Firstly, the configuration of the circuit will be described, secondly, functional and design related issues will be explained. The balanced crystal oscillator comprises two like oscillator subcircuits or subcircuits 302 and 301. Each subcircuit comprises a capacitor 306, 305 and an active device in the form of a transistor 304, 303. The subcircuits are coupled together by means of three interconnections, where each interconnection consists of a pair of like type of transistor terminals. A first of the three interconnections comprise a piezoelectric crystal (Xtal) 313, which couples the base terminal of transistor 304 to the base terminal of transistor 303. Additionally, the interconnection comprises a resistor Rf 311, 308 of the respective subcircuits. Hence, the base terminals are coupled together via the resistors 311, 308, and the crystal 313. A second of the three interconnections comprise a resonator element in the form of a capacitor 314, which couples the emitter terminal of transistor 304 to the emitter terminal of transistor 303. A third of the three interconnections connects the collector terminal of transistor 304 and the collector terminal of transistor 303 to a ground reference, gnd.

A balanced (i.e. two-wire) output oscillator signal is provided either across the piezoelectric crystal 313 at terminals T7a and T7b or across the capacitor 314 at circuit junctions or terminals T8a and T8b. Hence, the balanced output signal is provided at one of the of the pairs of like type of transistor terminals i.e. at the pair of base terminals or at the pair of emitter terminals.

A bias subcircuit for the dual common-collector oscillator can be implemented as depicted in FIG. 3. Here, the resistors Rb 310, 307 connect the BJT base-terminals to a bias voltage source Vb 317, 318. This bias voltage may be derived from a band gap reference, via a voltage divider, etc. Rb 310, 307 should be chosen to be large enough to avoid unnecessary loading of the resonator circuit, but not too high such that BJT current-gain ($\beta_F$) variations will render the bias point unstable. Resistors Re 316, 315 provide current bias to the active devices 304, 303. These resistors 316, 315 can be replaced by active current sources, if sufficiently high supply voltage is available, but resistors may offer an advantage with respect to better substrate isolation.

Undesired and spurious oscillation modes can be suppressed by means of an RC filter formed by the resistors Rf 311, 308 and capacitors Cf 312, 309. The resistors, together with Cf 312, 309 and the BJT (or MOS when applicable) input capacitance, form a loop-gain pole that can be tailored such that only the desired mode of oscillations will be possible. The capacitors Cf 312, 309 may be omitted, as the input capacitors of the active devices may suffice, or replaced by a single capacitor across the bases when no common-mode rejection is desired. This will not require a change of the capacitors 306, 305 and 314, which in combination with the crystal form the resonator subcircuit. Typically, capacitors 306 and 305 are selected to have approximately twice the capacity of capacitor 314.

Any substrate coupled noise, via the collector substrate parallel-plate capacitor will be deviated to a signal ground (e.g. gnd) and will not enter the transistor.

Figure 4:
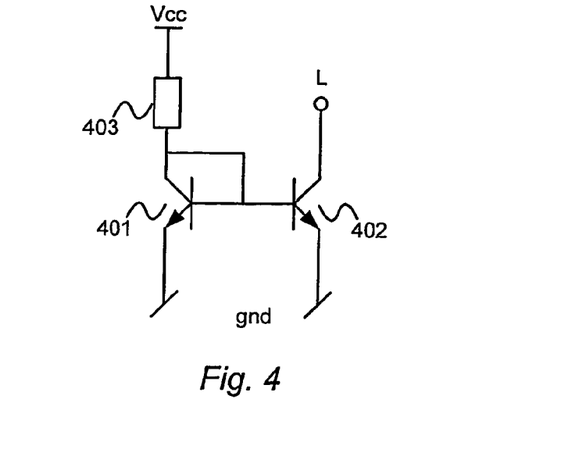
FIG. 4 shows a current source.

FIG. 4 shows a current source. This current source or other appropriate current sources can be applied to provide bias current to the transistors 304 and 303 when a sufficiently high supply voltage is present and when a stable operating point of the transistors is required. This is accomplished by replacing each of the resistors 316 and 315 with a current source or current mirror.

It is well known how to apply the current source to bias the transistors, but for completeness, the terminal denoted L (corresponding to the collector terminal of the transistor 402) is connected to the emitter terminal of transistors 304 and 303. The emitter terminal of transistor 402 is coupled to the ground reference. The base terminal of transistor 402 is connected to a base-collector junction of transistor 401. This junction is connected to the one end of a resistor 403, which at its opposite end is connected to supply voltage (Vcc). The emitter terminal of transistor 401 is connected to the ground reference, gnd. In a practical embodiment, the two current sources that replace resistors Re 316 and 315 will be embodied to share the same transistor 401 and resistor 403 thereby making a base-base connection from transistor 401 to 402a and from 401 to 402b where indexes a and b indicate a current source for either subcircuit 302 or 301.

Figure 5:
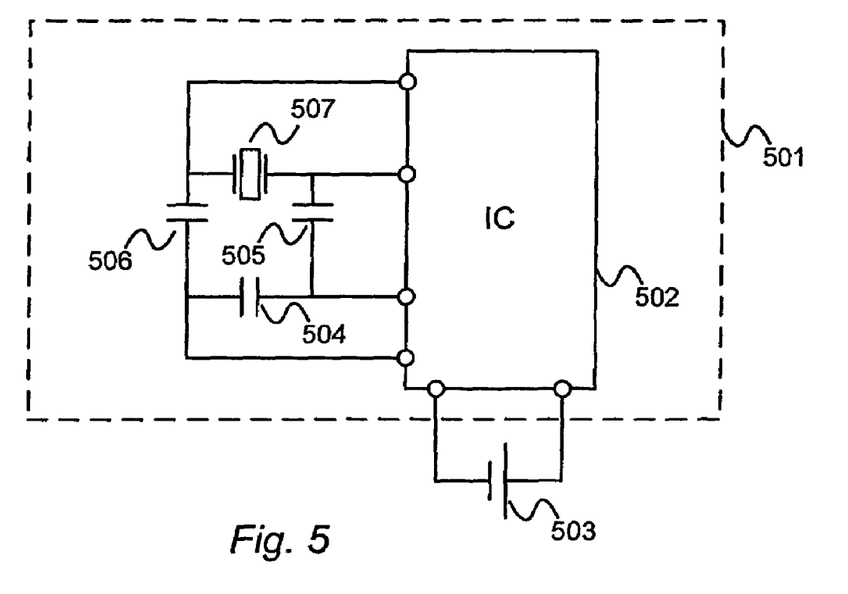
FIG. 5 shows a balanced crystal oscillator with external resonator elements.

FIG. 5 shows a balanced crystal oscillator with external resonator elements. An electric circuit 501 operated from e.g. a battery 503 or another power supply comprises an integrated circuit 502 and components 504, 505, 506, and 507 external to the integrated circuit. Typically, the integrated circuit 502 and the external components 504-507 are mounted on a Printed Circuit Board, PCB. The reason for placing the components 504, 505, 506, and 507 external to the integrated circuit is primarily due to the fact that these components typically occupy too much space on the integrated circuit.

For the dual common collector oscillator the capacitor 208; 314 can be placed external to integrated circuit as illustrated by capacitor 504. Similarly, the capacitors 206; 306, 205; 305, and crystal 207; 313 can be placed external to integrated circuit as illustrated by capacitor 505, 506 and crystal 507. Bias circuitry, active devices (transistors), filters etc. of the balanced oscillator, according to the invention, are preferably placed on the integrated circuit.

To conclude, a highly integrated differential crystal oscillator with high common-mode rejection, good substrate interference immunity, protection against parasitic resonance modes and low sensitivity to RF interference is disclosed.

Although the preceding discussion has been based on the crystal as the most frequency selective element, it is possible to replace the Xtal by an inductor, a ceramic resonator, or another component with the proper impedance characteristic. A crystal will, however, typically yield the highest frequency stability performance.

Generally, the term 'ground reference' denotes a reference as seen from a signal model point of view. Hence, a ground reference can be tied to power supply voltage potentials (gnd or Vcc) or other substantially fixed voltage potentials.

Generally, the term 'subcircuit' has been used as a term for a part of an electronic circuit, but alternative terms such as 'circuit network' or 'network' or 'circuit' etc. are equivalent therewith.

The invention claimed is:

1. A balanced crystal oscillator circuit having a piezoelectric element, a first oscillator sub-circuit incorporating a first transistor and a second oscillator sub-circuit incorporating a second transistor, wherein the transistors are of the Bipolar Junction Transistor (BJT) type and each have different types of transistor terminals and wherein the oscillator sub-circuits are configured with a first, second and third interconnection, the circuit further comprising:

each interconnection being made at a pair of like type of transistor terminals of the first and second transistors;

the first interconnection being between a pair of like type of transistor terminals and a connection to a ground reference;

the second interconnection being between a pair of like type of transistor terminals with a first resonator element therein-between; and the third interconnection being between a pair of like type of transistor terminals with a second resonator element therein-between, wherein at least one of the transistors is provided with bias current and said first and second oscillator circuits being arranged to interact by means of said first and second resonator elements to form a balanced oscillator signal; and wherein the first, second, and third of said interconnections consist of a pair of collector-type terminals, base-type terminals, and emitter-type terminals, respectively; thereby configuring the balanced oscillator circuit with a dual common-collector transistor coupling.

2. The balanced crystal oscillator circuit according to claim 1, wherein the balanced oscillator signal is provided at a first circuit junction and at a second circuit junction coupled to a first and second terminal, respectively, from one of the pairs of like type of transistor terminals interconnected by either the first or second resonator element.

3. The balanced crystal oscillator circuit according to claim 1, wherein the first resonator element is a piezoelectric element and the second resonator element is a capacitor.

4. The balanced crystal oscillator circuit according to claim 1, wherein at least one of the transistors is provided with bias current by means of a resistor coupled between the emitter of a transistor and a supply voltage.

5. The balanced crystal oscillator circuit according to claim 1, wherein the transistors are operated in class C.

6. The balanced crystal oscillator circuit according to claim 1 wherein the oscillator circuit is configured with a circuit forming a loop-gain pole in the frequency range above a primary oscillating frequency of the oscillating output signal.

7. The balanced crystal oscillator circuit according to claim 1, wherein the non-resonator elements of the circuit are implemented on an integrated circuit, said integrated circuit having terminals for electric interconnection with the resonator elements.

8. The balanced crystal oscillator circuit according to claim 7, wherein one of the resonator elements is a piezoelectric element, said integrated circuit having terminals for electric interconnection with the piezoelectric element.

9. The balanced crystal oscillator circuit according to claim 1, implemented in a mobile telephone.

10. The balanced crystal oscillator circuit according to claim 6 wherein the circuit forming a loop-gain pole in the frequency range above a primary oscillating frequency of the oscillating output signal is a resistive-capacitive (RC) circuit.

11. A balanced crystal oscillator circuit having a piezoelectric element, a first oscillator sub-circuit incorporating a first transistor and a second oscillator sub-circuit incorporating a second transistor, wherein the transistors are of the Metal Oxide Semiconductor (MOS) type and each have different types of transistor terminals and wherein the oscillator sub-circuits are configured with a first, second and third interconnection, the circuit further comprising: each interconnection being made at a pair of like type of transistor terminals of the first and second transistors;

the first interconnection being between a pair of like type of transistor terminals and a connection to a ground reference;

the second interconnection being between a pair of like type of transistor terminals with a first resonator element therein-between; and the third interconnection being between a pair of like type of transistor terminals with a second resonator element therein-between;

wherein at least one of the transistors is provided with bias current and said first and second oscillator circuits being arranged to interact by means of said first and second resonator elements to form a balanced oscillator signal, and wherein the first, second, and third of said interconnections consist of a pair of drain-type terminals, gate-type terminals, and source-type terminals, respectively; thereby configuring the balanced oscillator circuit with a dual common-drain transistor coupling.

12. The balanced crystal oscillator circuit according to claim 11, wherein the first resonator element is a piezoelectric element and the second resonator is a capacitor.

13. The balanced crystal oscillator circuit according to claim 11 wherein the oscillator circuit is configured with a circuit forming a loop-gain pole in the frequency range above a primary oscillating frequency of the oscillating output signal.

14. The balanced crystal oscillator circuit according to claim 13 wherein the circuit forming a loop-gain pole in the frequency range above a primary oscillating frequency of the oscillating output signal is a resistive-capacitive (RC) circuit.

15. The balanced crystal oscillator circuit according to claim 11, wherein the non-resonator elements of the circuit are implemented on an integrated circuit, said integrated circuit having terminals for electric interconnection with the resonator elements.

16. The balanced crystal oscillator circuit according to claim 15, wherein one of the resonator elements is a piezoelectric element, said integrated circuit having terminals for electric interconnection with the piezoelectric element.

17. The balanced crystal oscillator circuit according to claim 11, implemented in a mobile telephone.

* * * * *